(12) United States Patent
Han et al.

(10) Patent No.: US 6,660,594 B2
(45) Date of Patent: Dec. 9, 2003

(54) METHODS OF FORMING INTEGRATED CIRCUIT DEVICES HAVING GATE OXIDE LAYERS WITH DIFFERENT THICKNESSES AND INTEGRATED CIRCUIT DEVICES FORMED THEREBY

(75) Inventors: Seung-hoon Han, Kyungki-do (KR); Duck-hyung Lee, Kyungki-do (KR); Dong-woo Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/216,506

(22) Filed: Aug. 9, 2002

(65) Prior Publication Data

US 2003/0030111 A1 Feb. 13, 2003

(30) Foreign Application Priority Data

Aug. 10, 2001 (KR) ..................... 2001-0048288

(51) Int. Cl.$^7$ .......................... H01L 21/8234
(52) U.S. Cl. ............... 438/275; 438/636; 438/981
(58) Field of Search ................ 438/210, 241, 438/258, 275, 592, 634, 636, 655, 656, 981

(56) References Cited

U.S. PATENT DOCUMENTS

| | | | | |
|---|---|---|---|---|
| 5,668,035 A | * | 9/1997 | Fang et al. | 438/241 |
| 6,333,222 B1 | * | 12/2001 | Kitazawa et al. | 438/241 |
| 6,333,223 B1 | * | 12/2001 | Moriwaki et al. | 438/241 |
| 6,337,240 B1 | * | 1/2002 | Chu | 438/981 |

* cited by examiner

Primary Examiner—Chandra Chaudhari
(74) Attorney, Agent, or Firm—Myers Bigel Sibley & Sajovec, P.A.

(57) ABSTRACT

An integrated circuit device, such as a merged device, is formed by forming a first gate oxide layer on a first region, such as a logic circuit region, of a substrate. A conductive layer is formed on the first gate oxide layer. A second gate oxide layer is formed on a second region, such as a cell array region, of the substrate. A first gate pattern is formed on the second gate oxide layer. The conductive layer and the first gate oxide layer are patterned to form a second gate pattern. A silicide layer is formed on the second gate pattern and in the substrate adjacent to the second gate pattern.

24 Claims, 7 Drawing Sheets

METHODS OF FORMING INTEGRATED CIRCUIT DEVICES HAVING GATE OXIDE LAYERS WITH DIFFERENT THICKNESSES AND INTEGRATED CIRCUIT DEVICES FORMED THEREBY

RELATED APPLICATION

This application claims the benefit of Korean Patent Application No. 2001-48288, filed Aug. 10, 2001, the disclosure of which is hereby incorporated herein by reference.

FIELD OF THE INVENTION

The present invention relates generally to integrated circuit devices and methods of forming same and, more particularly, to integrated circuit memory devices and methods of forming same.

BACKGROUND OF THE INVENTION

As the integration density of integrated circuit devices increases, the size of transistors used therein may be reduced. In addition, the length of gates and/or the thickness of gate oxide layers may be reduced. By reducing the thickness of a gate oxide layer, the operational speed of an integrated circuit device may be increased; however, the reduced gate oxide layer thickness may increase the susceptibility to break down.

Integrated circuit devices may include memory cell areas that occupy relatively large amounts of chip area. If a gate oxide layer has a uniform thickness throughout a chip, then break down is generally more likely to occur first in a memory cell area, which may degrade operation. To address this problem, a gate oxide layer may be more thickly formed in a cell array area than in a logic circuit area because break down voltage typically increases as the gate oxide layer thickness is increased and decreases as the gate oxide layer thickness is decreased. Thus, to enhance reliability of an integrated circuit device, the thickness of gate oxide layers in the cell array area may be different than the thickness of the gate oxide layers in the logic circuit area.

Integrated circuit devices may comprise a highly integrated DRAM and one or more high-speed logic circuits in the same chip. The gate patterns in the cell array area may be self-aligned and may have stacked gate structures, which are protected by a silicon nitride layer (SiN). These patterns may be called stacked gate patterns. Gate patterns in the logic circuit area may comprise silicide gate structures having a surface channel. These patterns may be called silicide gate patterns. A device that comprises both a stacked gate pattern and a suicide gate pattern may be called a merged device.

When forming stacked gate patterns and/or silicide gate patterns, the threshold voltage of a merged device may change and/or boron from a PMOS transistor may break away due to heat generated during a thermal treatment that is applied during the fabrication process.

SUMMARY OF THE INVENTION

According to some embodiments of the present invention, an integrated circuit device, such as a merged device, is formed by forming a first gate oxide layer on a first region, such as a logic circuit region, of a substrate. A conductive layer is formed on the first gate oxide layer. A second gate oxide layer is formed on a second region, such as a cell array region, of the substrate. A first gate pattern is formed on the second gate oxide layer. The conductive layer and the first gate oxide layer are patterned to form a second gate pattern. A silicide layer is formed on the second gate pattern and in the substrate adjacent to the second gate pattern.

In other embodiments of the present invention, the second gate oxide layer is formed on the conductive layer and on the cell array region of the substrate. Patterning the conductive layer and the first gate oxide layer may include the operations of forming an anti-reflective layer on the second gate oxide layer in the logic circuit region of the substrate, patterning the anti-reflective layer to form an anti-reflective layer pattern, and etching the second gate oxide layer, the conductive layer, and the first gate oxide layer using the anti-reflective layer pattern as an etching mask to form the second gate pattern. The anti-reflective layer may comprise at least one of SiN and SiON.

In still other embodiments, the conductive layer is a first conductive layer and operations for forming the first gate pattern include forming a second conductive layer on the second gate oxide layer, forming a polycide layer on the second conductive layer, forming a silicon nitride layer on the second conductive layer, forming a mask pattern on the silicon nitride layer, and etching the silicon nitride layer, the polycide layer, and the second conductive layer using the mask pattern as an etching mask. In particular embodiments, the first conductive layer is at least as thick as the second conductive layer.

Although embodiments of the present invention have been described above primarily with respect to fabrication method embodiments, embodiments of integrated circuit devices formed by such fabrication methods are also provided.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
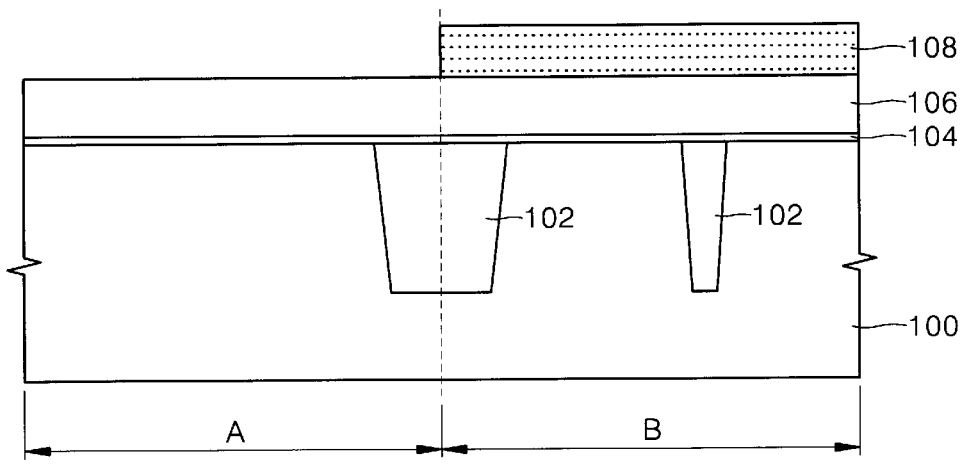
FIGS. 1–14 are cross sectional views that illustrate methods of forming integrated circuit devices having oxide layers with different thicknesses in accordance with various embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

FIGS. 1–14 are cross sectional views that illustrate methods of forming integrated circuit devices having oxide layers with different thicknesses in accordance with various embodiments of the present invention. Referring now to FIG. 1, a first gate oxide layer 104 and a conductive layer 106 are sequentially formed on an integrated circuit substrate 100 in which a memory cell array area or region A and a logic circuit area or region B are defined. The substrate 100 also comprises shall trench isolation (STI) areas 102, which are schematically shown in FIG. 1. The STI areas 102 may comprise other forms in accordance with various embodiments of the present invention. A first photoresist pattern 108 is formed on the logic circuit area B to define the memory cell area A and the logic circuit area B.

Figure 2:
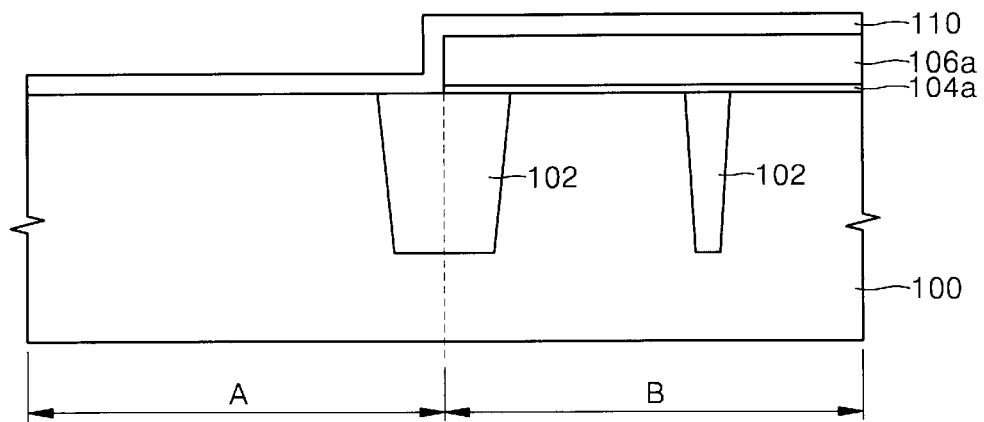

Referring now to FIG. 2, the first gate oxide layer 104 and the first conductive layer 106 are etched using the first photoresist pattern 108 as an etching mask to form the first gate oxide layer pattern 104a and a first conductive layer pattern 106a. The first photoresist pattern 108 is removed and a second gate oxide layer 110 is formed on the first conductive pattern 106a in the logic circuit are B and on the surface of the cell array area A in which the substrate 100 is exposed. In accordance with some embodiments of the present invention, the second gate oxide layer 110 is thicker than the first gate oxide layer 104, which may reduce the susceptibility to voltage break down in the cell array area A.

Thus, as described above, gate oxide layers having different thicknesses, in accordance with some embodiments of the present invention, may be formed by forming a first gate oxide layer 104, removing the first gate oxide layer 104 in the cell array area A, and forming the second gate oxide layer 110. The order of forming the first and second gate oxide layers 104 and 110 may facilitate the simultaneous formation of stacked gate patterns (see stacked gate patterns 120 of FIG. 4) of a stacked gate structure and/or suicide gate patterns (see silicide gate patterns 139 of FIG. 12) of a suicide structure.

Figure 3:
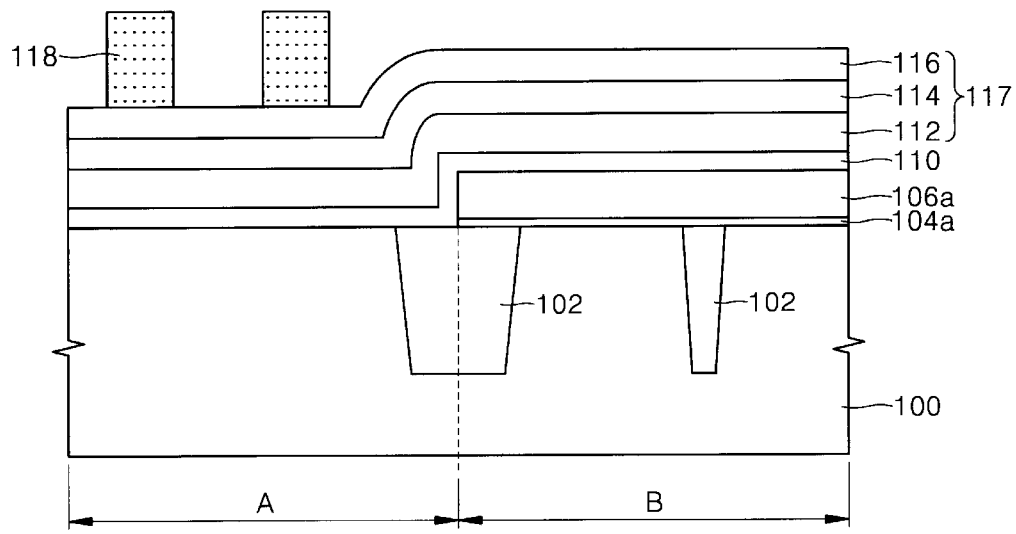

Referring now to FIG. 3, a second conductive layer 112, a polycide layer 114, and a silicon nitride layer 116 are sequentially formed on the surface of the second gate oxide layer 110. The second conductive layer 112, the polycide layer 114, and the silicon nitride layer 116 form a stacked gate 117. The height of the stacked gate patterns 120 of FIG. 4 in the cell array area A may be adjusted to facilitate the formation of a self-aligned contact and/or ion implantation, which may be performed in subsequent processes. The height of gate patterns 132 of FIG. 9 in the logic circuit area B (hereinafter "logic gate patterns") may be determined based on desired characteristics of a high-speed transistor. Thus, in particular embodiments of the present invention, the second conductive layer 112 is thinner than or about the same thickness as the first conductive layer 106.

Figure 4:
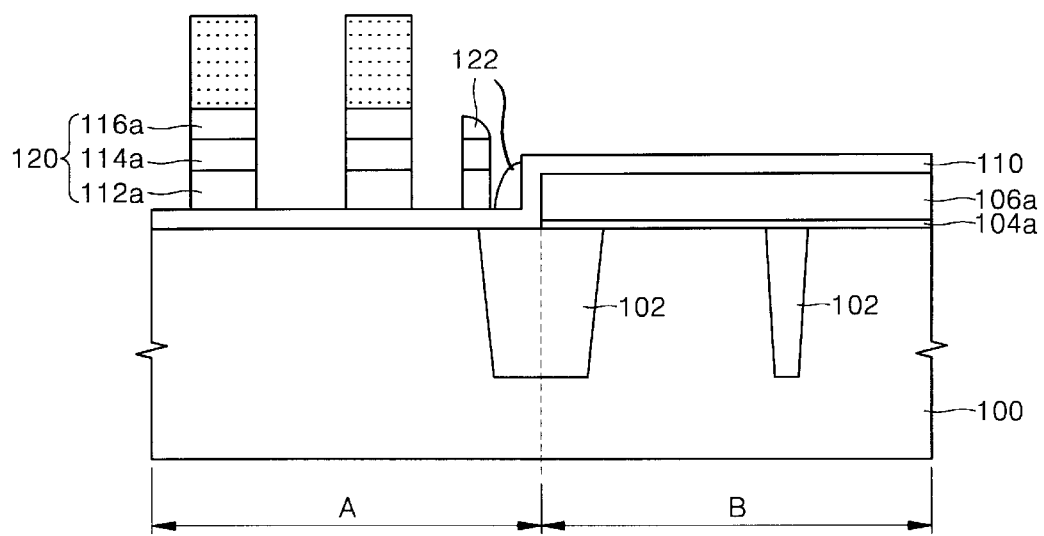

The polycide layer 114 may comprise, for example, WSi and/or TiSi and may be used to lower the resistance of the gates. The thickness of the polycide layer 114 and the thickness of the silicon nitride layer 116 may be determined based on considerations relating to formation of a self-aligned contact and/or ion implantation, which may be performed in subsequent processes as discussed above. As shown in FIGS. 3 and 4, a second photoresist pattern 118 is formed on the cell array area A and is used to define the stacked gate patterns 120.

In particular, the silicon nitride layer 116, the polycide layer 114, and the second conductive layer 112 are etched using the second photoresist pattern 118 as an etching mask to expose the second gate oxide layer 110 and thereby form the stacked gate patterns 120. The second photoresist pattern 118 is then removed. The stacked gate patterns 120 comprise silicon nitride layer patterns 116a, polycide layer patterns 114a, and second conductive patterns 112a.

Figure 5:
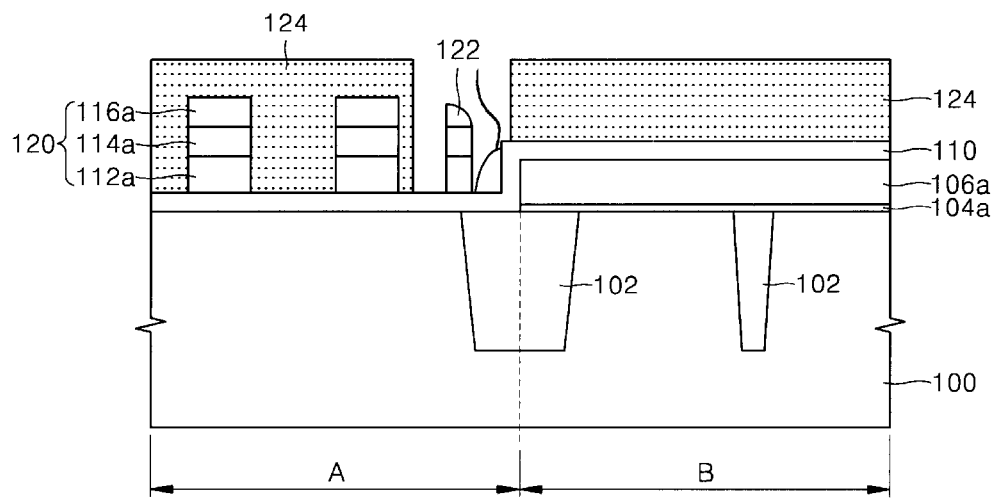

A residue 122 may remain after the etching is complete. Because the residue 122 may negatively affect operations of the integrated circuit device, the residue 122 may be removed. Referring now to FIG. 5, a third photoresist pattern 124 is formed and is used as a mask in removing the residue 122 between the stacked gate patterns 120 and the logic circuit area B. The third photoresist pattern 124 is then removed.

Figure 6:
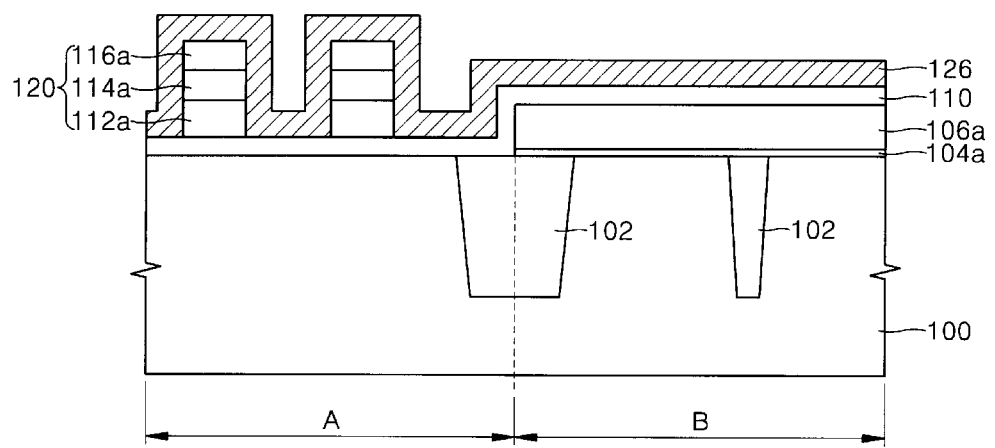

Referring now to FIG. 6, an anti-reflective layer 126 may be formed by, for example, a blanket method, on the surface of the second gate oxide layer 110 on which the stacked gate patterns 120 are formed. The anti-reflective layer 126 may comprise, for example, SiN and/or SiON in accordance with some embodiments of the present invention.

Figure 7:
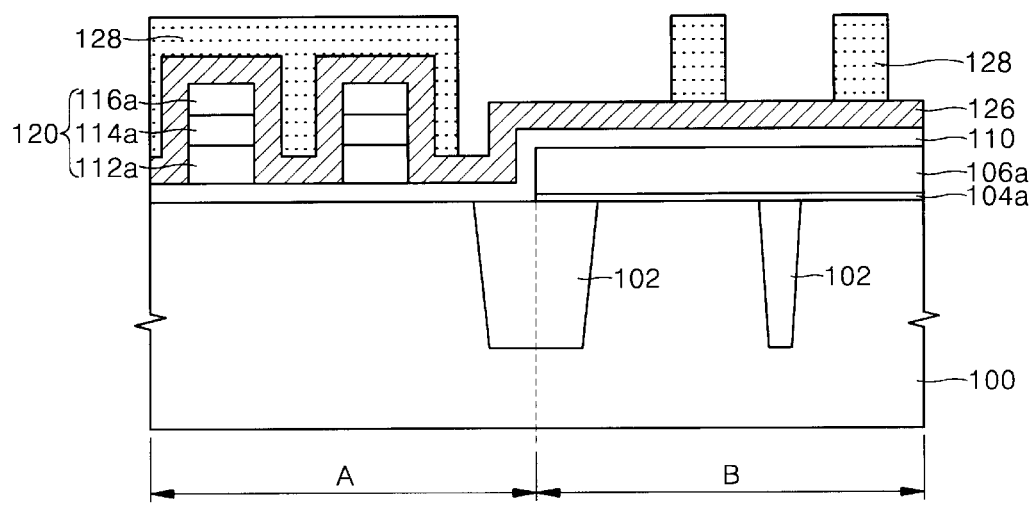
Figure 8:
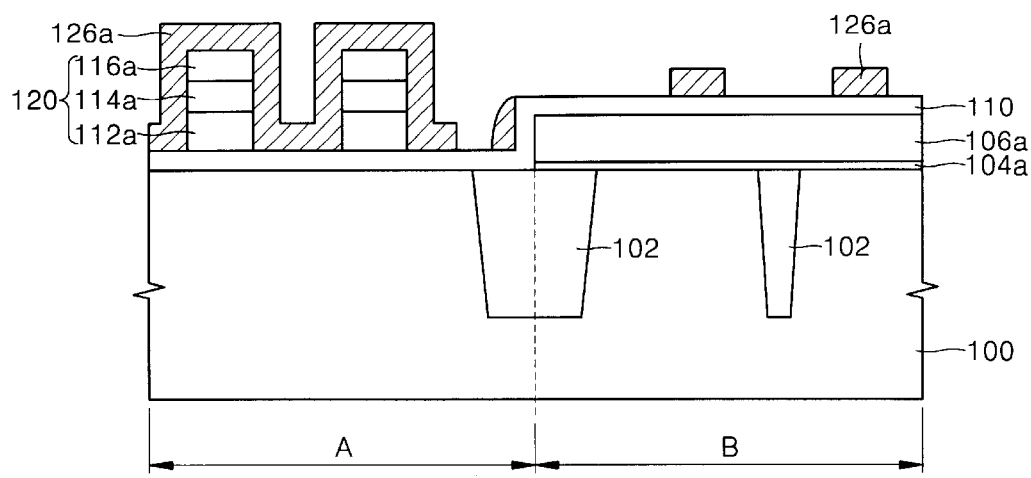
Figure 9:
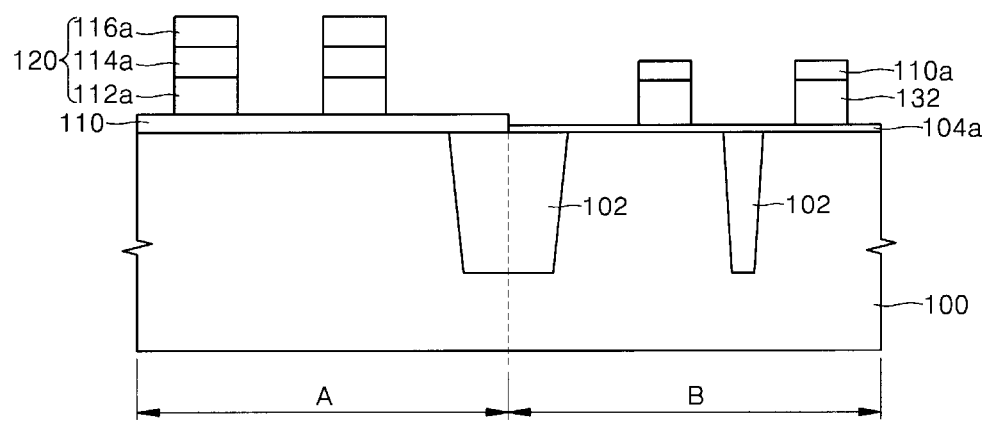

Referring now to FIGS. 7 and 8, a fourth photoresist pattern 128 for defining the logic gate patterns 132 of FIG. 9 is formed. The anti-reflective layer 126 is etched using the fourth photoresist pattern 128 as an etching mask to expose the second gate oxide layer 110, thereby forming anti-reflective layer patterns 126a. The fourth photoresist pattern 128 is then removed.

Referring now to FIG. 9, the second gate oxide layer 110 and the first conductive layer pattern 106a in the logic circuit area B are etched using the anti-reflective layer patterns 126a as an etching mask to expose the first gate oxide layer pattern 104a. The anti-reflective layer patterns 126a may be removed by wet etching. In accordance with some embodiments of the present invention, the wet etchant may have an etch selectivity of about 10:1–20:1 of the anti-reflective layer 126 to the second gate oxide layer 110. Thus, the second gate oxide layer patterns 110a may remain on the logic gate patterns 132.

In general, the thickness of layers to be etched may impact the reliability of an etching process. Typically, the thinner the layers are to be etched, the more stable the etching process, which may improve the reliability of an integrated circuit device formed thereby. Advantageously, by forming the logic gate patterns 132 using the anti-reflective layer patterns 126a as an etching mask, the thickness of layers to be etched may be reduced. If photoresist patterns are used as an etching mask, then the first conductive layer pattern 106a, the second gate oxide layer 110, and the anti-reflective layer 126 would be etched. In contrast, according to some embodiments of the present invention, the anti-reflective layer 126 is used as an etching mask and the first conductive layer pattern 106a and the second gate oxide layer 110 are etched. As a result, the reliability of the logic gate patterns 132 may be improved.

Figure 10:
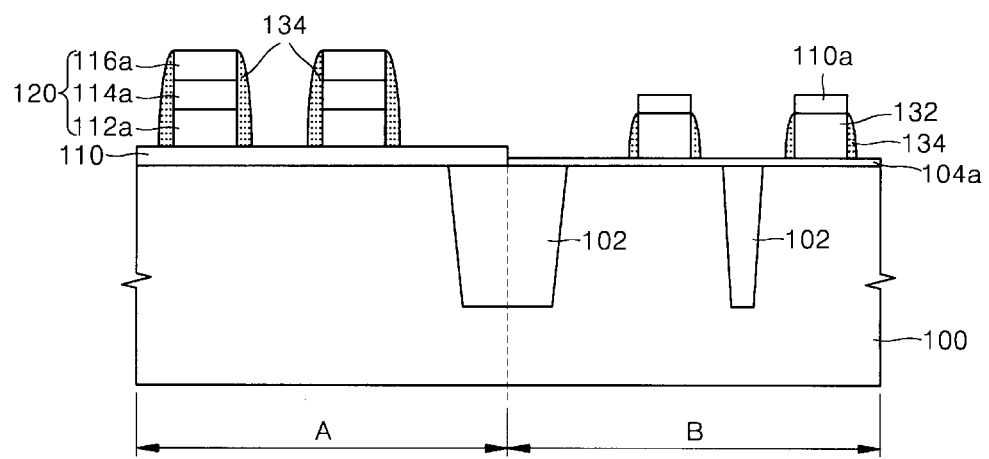

Referring now to FIG. 10, spacers 134 are formed on the sidewalls of the stacked gate patterns 120 and the logic gate patterns 132. The spacers 134 may comprise silicon oxide and/or silicon nitride.

Figure 11:
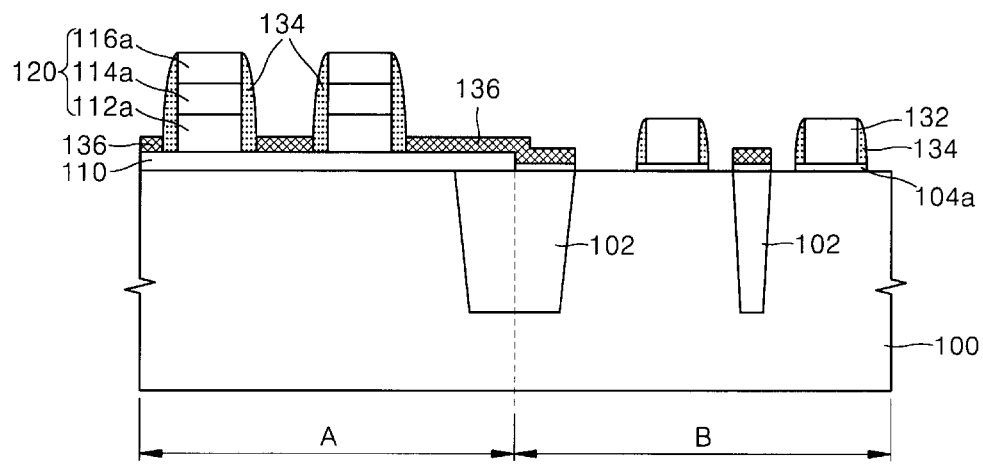

Referring now to FIG. 11, a blocking layer pattern 136, which may comprise silicon nitride, is formed as shown, and portions of the first gate oxide layer 104a are removed. In addition, the second gate oxide layer patterns 110 remaining on the logic gate patterns 132 are also removed. As a result, surfaces of the substrate 100 next to the sidewalls of the logic gate patterns 132 and the upper surfaces of the logic gate patterns 132 are exposed.

Figure 12:
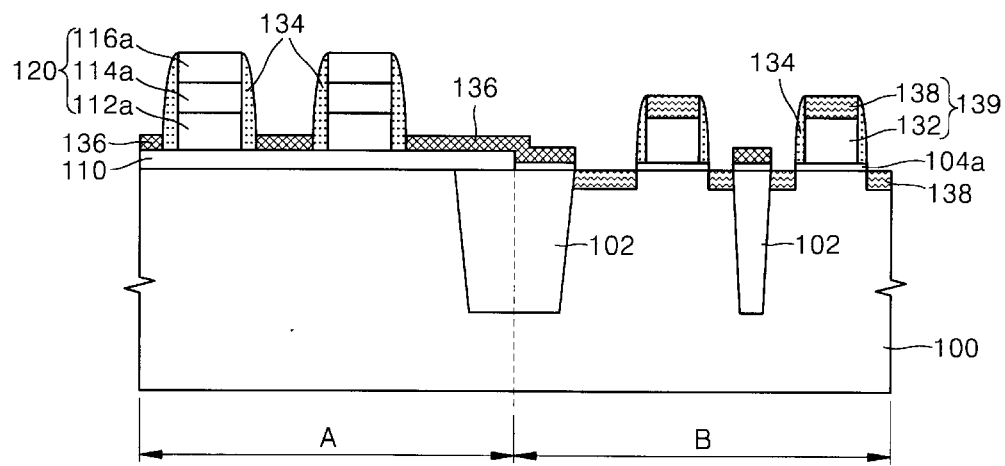

Referring now to FIG. 12, silicide layers 138 are formed in the substrate 100 underneath and adjacent to the sidewalls of the logic gate patterns 132. In some embodiments of the present invention, the silicide layers 138 comprise CoSi. In other embodiments, the silicide layers 138 comprise WSi, TiSi, and/or CoSi. The silicide layers 138 may lower the resistance of active layers between the logic gate patterns 132 and the substrate 100. The silicide layers 138 and the logic gate patterns 132 comprise the silicide gate patterns 139. Thus, the stacked gate patterns 120 are formed in the cell array area A and the silicide gate patterns 139 are formed in the logic circuit area B.

Figure 13:
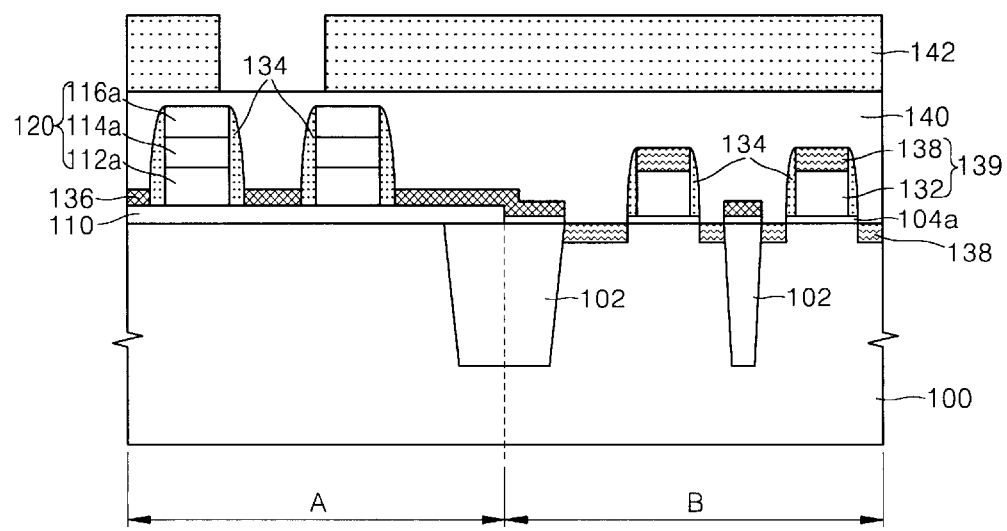

Referring now to FIG. 13, an interlevel insulating layer 140, which may comprise an oxide layer and/or a nitride layer, is formed on both the cell array area A and the logic circuit area B as shown. A fifth photoresist pattern 142 is formed on the interlevel insulating layer 140 and is used in forming a contact between the stacked gate patterns 120.

Figure 14:
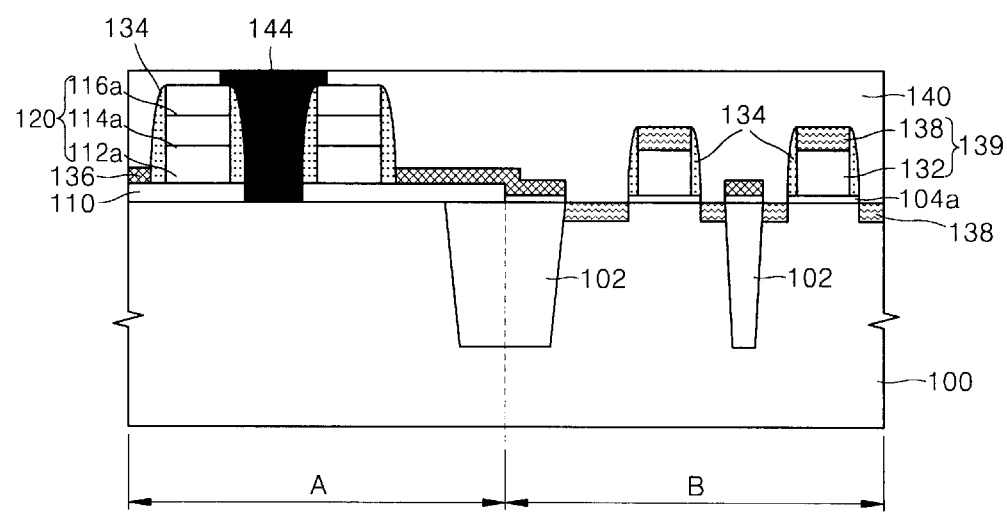

Referring now to FIG. 14, the interlevel insulating layer 140, the blocking layer pattern 136, and the second gate oxide layer 110 are etched using the firth photoresist pattern 142 as an etching mask to expose the substrate 100. A contract 144 for a metal line, which may have generally good filling characteristics, is formed between the stacked gate patterns 120. The fifth photoresist pattern 142 is removed. In accordance with various embodiments of the present invention, the contact 144 may be embodied as a single layer comprising any one of Cu, Al, W, Ti, Zr, Hf, V, Mo, and Cr. In other embodiments, the contact 144 may be embodied as a composite layer comprising any combination of Cu, Al, W, Ti, Zr, Hf, V, Mo, and Cr. In still other embodiments, the material may comprise a nitride, carbide, or suicide of Cu, Al, W, Ti, Zr, Hf, V, Mo, and Cr, or polysilicon doped with impurities.

The first gate oxide layer pattern 104a and the suicide layers 138 may prevent the threshold voltage of the merged device from changing and boron of a PMOS transistor from breaking away due to heat generated during a thermal treatment that is applied subsequently during the fabrication process. Embodiments of integrated circuit devices having gate oxide layers of different thicknesses have been described herein. Moreover, these embodiments may allow stacked gate patterns and silicide gate patterns to be formed using common processes and may resist heat damage from fabrication processing.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of forming an integrated circuit device, comprising:
   forming a first gate oxide layer on a first region of a substrate;
   forming a conductive layer on the first gate oxide layer;
   forming a second gate oxide layer on the conductive layer and on a second region of the substrate;
   forming a first gate pattern on the second gate oxide layer;
   forming an anti-reflective layer on the second gate oxide layer in the first region of the substrate;
   patterning the anti-reflective layer to form an anti-reflective layer pattern;
   etching the second gate oxide layer, the conductive layer, and the first gate oxide layer using the anti-reflective layer pattern as an etching mask to form a second gate pattern; and
   forming a silicide layer on the second gate pattern and in the substrate adjacent to the second gate pattern.

2. The method of claim 1, wherein the anti-reflective layer comprises at least one of SiN and SiON.

3. The method of claim 1, further comprising:
   wet etching the anti-reflective layer pattern from the second gate pattern.

4. The method of claim 3, wherein the wet etchant has an etch selectivity in a range of about 10:1–20:1 of the anti-reflective layer with respect to the second gate oxide layer.

5. The method of claim 1, wherein the first gate oxide layer is thinner than the second gate oxide layer.

6. The method of claim 1, wherein the conductive layer is a first conductive layer, and wherein forming the first gate pattern on the second gate oxide layer comprises:
   forming a second conductive layer on the second gate oxide layer;
   forming a polycide layer on the second conductive layer;
   forming a silicon nitride layer on the second conductive layer;
   forming a mask pattern on the silicon nitride layer; and
   etching the silicon nitride layer, the polycide layer, and the second conductive layer using the mask pattern as an etching mask to form the first gate pattern.

7. The method of claim 6, wherein the first conductive layer is at least as thick as the second conductive layer.

8. The method of claim 6, wherein the polycide layer comprises at least one of WSi and TiSi.

9. The method of claim 1, further comprising:
   forming a blocking layer pattern on the first region of the substrate such that the substrate is exposed adjacent to the second gate pattern.

10. The method of claim 9, wherein the blocking layer pattern comprises silicon nitride.

11. The method of claim 1, wherein the suicide layer comprises one of WSi, TiSi, and CoSi.

12. The method of claim 1, further comprising:
    removing residue on the second gate oxide layer after forming the first gate pattern.

13. A method of fabricating an integrated circuit device, comprising:
    forming a first gate oxide layer on a first region of a substrate;
    forming a conductive layer on the first gate oxide layer;
    forming a second gate oxide layer on the conductive layer and on a second region of the substrate;
    forming a first gate pattern on the second gate oxide layer;
    forming an anti-reflective layer on the second gate oxide layer in the first region of the substrate;
    patterning the anti-reflective layer to form an anti-reflective layer pattern;
    etching the second gate oxide layer, the conductive layer, and the first gate oxide layer using the anti-reflective layer pattern as an etching mask to form a second gate pattern;
    forming a blocking layer pattern on the first region of the substrate such that the substrate is exposed adjacent to the second gate pattern; and
    forming a silicide layer on the second gate pattern and in the substrate adjacent to the second gate pattern.

14. The method of claim 13, wherein the anti-reflective layer comprises at least one of SiN and SiON.

15. The method of claim 13, wherein the blocking layer pattern comprises silicon nitride.

16. The method of claim 13, wherein the suicide layer comprises one of WSi, TiSi, and CoSi.

17. The method of claim 13, further comprising:
removing residue on the second gate oxide layer after forming the first gate pattern.

18. A method of forming an integrated circuit device, comprising:
forming a first gate oxide layer on a first region of a substrate;
forming a conductive layer on the first gate oxide layer;
forming a second gate oxide layer on a second region of the substrate;
forming a first gate pattern on the second gate oxide layer;
patterning the conductive layer and the first gate oxide layer to form a second gate pattern;
forming a blocking layer pattern on the first region of the substrate such that the substrate is exposed adjacent to the second gate pattern; and
forming a silicide layer on the second gate pattern and in the substrate adjacent to the second gate pattern.

19. The method of claim 18, wherein the blocking layer pattern comprises silicon nitride.

20. The method of claim 18, wherein the first gate oxide layer is thinner than the second gate oxide layer.

21. The method of claim 18, wherein the conductive layer is a first conductive layer, and wherein forming the first gate pattern on the second gate oxide layer comprises:
forming a second conductive layer on the second gate oxide layer;
forming a polycide layer on the second conductive layer;
forming a silicon nitride layer on the second conductive layer;
forming a mask pattern on the silicon nitride layer; and
etching the silicon nitride layer, the polycide layer, and the second conductive layer using the mask pattern as an etching mask to form the first gate pattern.

22. The method of claim 21, wherein the first conductive layer is at least as thick as the second conductive layer.

23. The method of claim 21, wherein the polycide layer comprises at least one of WSi and TiSi.

24. The method of claim 18, wherein the suicide layer comprises one of WSi, TiSi, and CoSi.

* * * * *

UNITED STATES PATENT AND TRADEMARK OFFICE
CERTIFICATE OF CORRECTION

PATENT NO.    : 6,660,594 B2
DATED         : December 9, 2003
INVENTOR(S)   : Han et al.

It is certified that error appears in the above-identified patent and that said Letters Patent is hereby corrected as shown below:

Title page,
Item [75], Inventors, Dong-woo Kim's residence should read -- Kyungki-do (KR) --

Column 7,
Line 1, should read -- 16. The method of claim 13, wherein the silicide layer --

Column 8,
Line 21, should read -- 24. The method of claim 18, wherein the silicide layer --

Signed and Sealed this

Twenty-first Day of September, 2004

JON W. DUDAS
*Director of the United States Patent and Trademark Office*